United States Patent
Principe et al.

(10) Patent No.: US 10,892,726 B2
(45) Date of Patent: Jan. 12, 2021

(54) PULSE BASED AUTOMATIC GAIN CONTROL FOR ANALOG AND PULSE DOMAIN REGULATION

(71) Applicant: University of Florida Research Foundation, Inc., Gainesville, FL (US)

(72) Inventors: Jose C. Principe, Gainesville, FL (US); Gabriel Nallathambi, San Jose, CA (US)

(73) Assignee: University of Florida Research Foundation, Incorporated, Gainesville, FL (US)

( * ) Notice: Subject to any disclaimer, the term of this patent is extended or adjusted under 35 U.S.C. 154(b) by 0 days.

(21) Appl. No.: 16/060,610

(22) PCT Filed: Dec. 9, 2016

(86) PCT No.: PCT/US2016/065859
§ 371 (c)(1),
(2) Date: Jun. 8, 2018

(87) PCT Pub. No.: WO2017/100596
PCT Pub. Date: Jun. 15, 2017

(65) Prior Publication Data
US 2018/0375484 A1    Dec. 27, 2018

Related U.S. Application Data

(60) Provisional application No. 62/265,573, filed on Dec. 10, 2015.

(51) Int. Cl.
*H03G 3/30* (2006.01)
*H03F 3/181* (2006.01)
*H03M 1/18* (2006.01)

(52) U.S. Cl.
CPC ........... *H03G 3/3005* (2013.01); *H03F 3/181* (2013.01); *H03G 3/30* (2013.01); *H03M 1/185* (2013.01)

(58) Field of Classification Search
CPC ........ H03G 3/3005; H03G 3/30; H03F 3/181; H03M 1/185
See application file for complete search history.

(56) References Cited

U.S. PATENT DOCUMENTS

| 4,578,625 A | 3/1986 | Nazarian et al. |
| 6,661,852 B1 | 12/2003 | Genrich |

(Continued)

FOREIGN PATENT DOCUMENTS

WO    WO-2016071671 A1 *    5/2016    .............. H03M 1/18

OTHER PUBLICATIONS

PCT International Search Report in co-pending, related PCT Application No. PCT/US2016/065859, dated Apr. 17, 2017.

(Continued)

*Primary Examiner* — Ping Lee
(74) *Attorney, Agent, or Firm* — Thomas | Horstemeyer, LLP

(57) ABSTRACT

Various methods and systems are related to pulse-based automatic gain control. In one example, pulse-based automatic gain control (AGC) includes a variable gain amplifier (VGA) configured to amplify an analog input signal to generate an analog output signal based upon an amplification control signal; an integrate-and-fire (IF) sampler configured to generate a pulse train corresponding to the analog output signal; and a gain adjustment configured to generate the amplification control signal based upon a comparison of time between pulses of the pulse train to a reference time. In another example, a method includes determining time between pulses of a pulse train corresponding to an analog (Continued)

output signal from a VGA; generating an amplification control signal based upon a comparison of the time between pulses of the pulse train to a reference time; and adjusting amplification of the VGA in response to the amplification control signal.

21 Claims, 6 Drawing Sheets

(56) References Cited

U.S. PATENT DOCUMENTS

| | | | |
|---|---|---|---|
| 7,019,930 | B1 | 3/2006 | Hennecken |
| 7,324,035 | B2 | 1/2008 | Harris et al. |
| 8,139,654 | B2 | 3/2012 | Chen et al. |
| 2007/0164823 | A1 | 7/2007 | Hsieh et al. |
| 2009/0046872 | A1* | 2/2009 | Vollmer ................ H04R 3/002 |
| | | | 381/102 |
| 2009/0091485 | A1* | 4/2009 | Daniels ................ G04F 10/005 |
| | | | 341/143 |
| 2009/0292336 | A1* | 11/2009 | Nishida ................ A61N 1/0529 |
| | | | 607/45 |
| 2015/0141857 | A1 | 5/2015 | Nallathambi |
| 2016/0126968 | A1* | 5/2016 | Lesso ..................... H03M 1/18 |
| | | | 341/155 |
| 2016/0218734 | A1* | 7/2016 | Malipatil ............. H03M 1/183 |
| 2016/0352557 | A1* | 12/2016 | Liao .................... H04L 27/3809 |

OTHER PUBLICATIONS

M. Rastogi, A. Singh Alvarado, J. G. Harris, and J. C. Principe, "Integrate and fire circuit as an adc replacement," in 2011 IEEE International Symposium on Circuits and Systems (ISCAS), May 2011, pp. 2421-2424.

A. Alvarado, J. Principe, and J. Harris, "Stimulus reconstruction from the biphasic integrate-and-fire sampler," in 4th International IEEE/EMBS Conference on Neural Engineering, 2009. NER '09., May 2009, pp. 415-418.

H. Feichtinger, J. Principe, J. Romero, A. Singh Alvarado, and G. Velasco, "Approximate reconstruction of bandlimited functions for the integrate and fire sampler," Advances in Computational Mathematics, pp. 1-12, 2012.

* cited by examiner

PULSE BASED AUTOMATIC GAIN CONTROL FOR ANALOG AND PULSE DOMAIN REGULATION

CROSS-REFERENCE TO RELATED APPLICATION

This application is the 35 U.S.C. § 371 national stage application of PCT Application No. PCT/US2016/065859, filed Dec. 9, 2016, the entirety of which is hereby incorporated by reference and which also claims priority to, and the benefit of, U.S. Provisional Application having Ser. No. 62/265,573, filed Dec. 10, 2015, the entirety of which is hereby incorporated by reference.

BACKGROUND

An automatic gain control (AGC) circuit is used in a system when the level of the input signal fluctuates over a wide dynamic range. A typical AGC system senses the amplitude of the signal and automatically adjusts the gain of the variable or programmable gain amplifier (VGA or PGA) to a constant level, for substantial variations in the dynamic range of the input signal.

SUMMARY

Embodiments of the present disclosure are related to pulse-based automatic gain control (AGC). The AGC can be used in both analog signal processing systems and pulse based signal processing systems.

In one embodiment, among others, an pulse-based automatic gain control (AGC) comprises a variable gain amplifier (VGA) configured to amplify an analog input signal to generate an analog output signal based upon an amplification control signal; an integrate-and-fire (IF) sampler configured to generate a pulse train corresponding to the analog output signal; and a gain adjustment configured to generate the amplification control signal based upon a comparison of time between pulses of the pulse train to a reference time. In one or more aspects of these embodiments, the IF sampler can be configured to detect the time between the pulses of the pulse train. The gain adjustment can be configured to: generate an error signal corresponding to the difference between the reference time and the time between the pulses of the pulse train; and adjust the error signal based upon a defined feedback factor to generate the amplification control signal. The gain adjustment can comprise a summer to generate the error signal and a multiplier to adjust the error signal by the feedback factor. The gain adjustment can be further configured to low pass filter the amplification control signal.

In one or more aspects of these embodiments, the gain adjustment can be configured to: generate an error signal corresponding to the difference between a function of the reference time and a function of the time between the pulses of the pulse train; and adjust the error signal based upon a defined feedback factor to generate the amplification control signal. The function of the reference time and the function of the time between the pulses can be the same function. Both the function of the reference time and the function of the time between the pulses can be a logarithmic function or an inverse function. The gain adjustment can be further configured to low pass filter the amplification control signal. The reference time can correspond to a time between the pulses of a pulse train generated by another IF sampler based upon a constant analog input signal. The reference time can include a refractory period of the IF sampler. The reference time can correspond to a time determined from a constant analog reference, an IF threshold and an IF leaky factor of the IF sampler. The reference time can be calculated analytically using a defined relationship between the constant analog reference, the IF threshold and the IF leaky factor of the IF sampler. The reference time can account for a refractory period of the IF sampler.

In another embodiment, a method comprises determining time between pulses of a pulse train corresponding to an analog output signal from a variable gain amplifier (VGA); generating an amplification control signal based upon a comparison of the time between pulses of the pulse train to a reference time; and adjusting amplification of the VGA in response to the amplification control signal. In one or more aspects of these embodiments, generating the amplification control signal can comprise generating an error signal corresponding to the difference between the reference time and the time between the pulses; and adjusting the error signal based upon a defined feedback factor to generate the amplification control signal. The amplification control signal can be low pass filtered. In one or more aspects of these embodiments, the method can comprise generating the pulse train from the analog output signal of the VGA using an integrate-and-fire (IF) sampler. The method can comprise determining the reference time based upon time between pulses of a pulse train generated from a constant analog reference signal using another IF sampler or a defined relationship between a constant analog reference, an IF threshold and an IF leaky factor of the IF sampler. The method can comprise determining the reference time based at least in part upon a constant analog reference, an IF threshold and an IF leaky factor of the IF sampler. The reference time can account for a refractory period of the IF sampler.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims. In addition, all optional and preferred features and modifications of the described embodiments are usable in all aspects of the disclosure taught herein. Furthermore, the individual features of the dependent claims, as well as all optional and preferred features and modifications of the described embodiments are combinable and interchangeable with one another.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Figure 1:
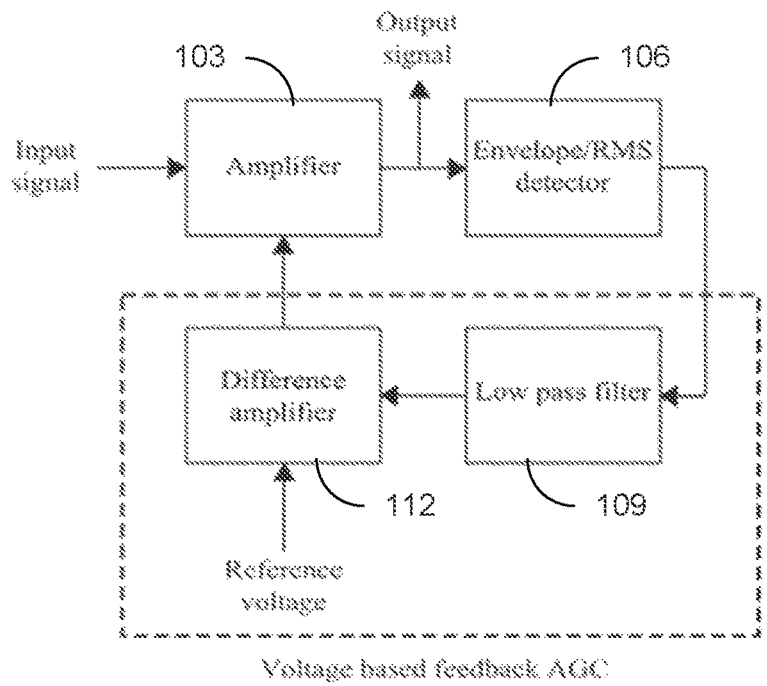
FIG. 1 is a schematic diagram illustrating an example of an automatic gain control (AGC) architecture in accordance with various embodiments of the present disclosure.

Disclosed herein are various embodiments related to pulse-based automatic gain control. Reference will now be made in detail to the description of the embodiments as illustrated in the drawings, wherein like reference numbers indicate like parts throughout the several views.

Recently time-based analog to pulse converters such as integrate and fire (IF) samplers have been proposed that encode the signal amplitude into a series of pulses (time events) where the time between pulses represents a constant area under the analog signal. It creates a one-to-one mapping with a unique inverse between signal amplitude and their pulse-based representations. As the time between the pulses encode a constant area, the pulse-based representation differs drastically with the amplitude of the input data; therefore, an automatic gain control (AGC) system can be used to meet the desired output level of the signal.

In this disclosure, a system to sense the time between the pulses of IF and automatically adjust the gain of the amplifier is presented. Sensing the time between pulses of IF is equivalent to estimating the instantaneous amplitude of the analog signal and hence the disclosed system provides dual controlled output, i.e., a regulated amplitude as well as regulated pulse representations despite fluctuations in the input.

The disclosed AGC can be used in the front end of modern analog electronic systems such as communication receivers, radar, audio systems, and video systems. The disclosed AGC can also regulate the output of analog-to-pulse converters with constraints on area. Currently there is no method to control the timing of the IF pulse train. So this is a novelty in the field. Moreover, the IF sampler (one of the main components) consumes extremely low power. Hence this can also be used in the front end of low power sensors, sensing systems and other biomedical applications.

Referring to FIG. 1, shown is an example of a negative voltage based feedback system, which is the most common form of automatic gain control (AGC). The input signal passes through the variable gain amplifier (VGA) 103, whose gain is controlled by an external signal. Then the rms (root mean square) detector 106 senses the input and converts it to a constant voltage that is proportional to the rms value of the input. The undesirable high frequency components are filtered out. The output of the filter 109 is compared against a reference voltage by a difference amplifier 112 to produce an error signal which is used to adjust the gain of the VGA 103.

Pulse Based AGC

Figure 2:
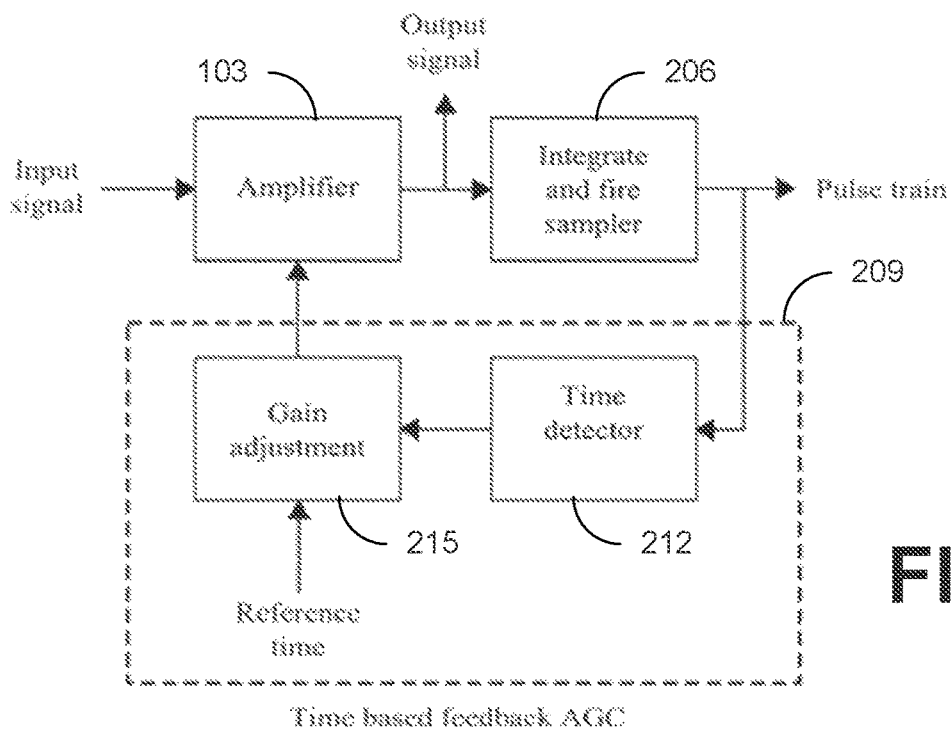
FIG. 2 is a schematic diagram illustrating an example of a pulse-based AGC architecture in accordance with various embodiments of the present disclosure.

Referring next to FIG. 2, shown are the main components of a pulse-based AGC architecture including an IF sampler 206 and a gain adjustment block 209. The output of the amplifier 103 is converted to continuous time pulses using the IF sampler 206. The time detector 212 gives the time between the pulses. However, note that since the IF sampler 206 encodes information in the time between pulses, in some implementations the IF sampler 206 itself can be used as a time detector to give the time between the pulses. The time between the pulses is compared against a reference time by a gain adjustment 215 to produce an error. The undesirable high frequency components of the error can be filtered out. The filtered signal serves as the control signal to vary the gain of the VGA 103.

Figure 3:
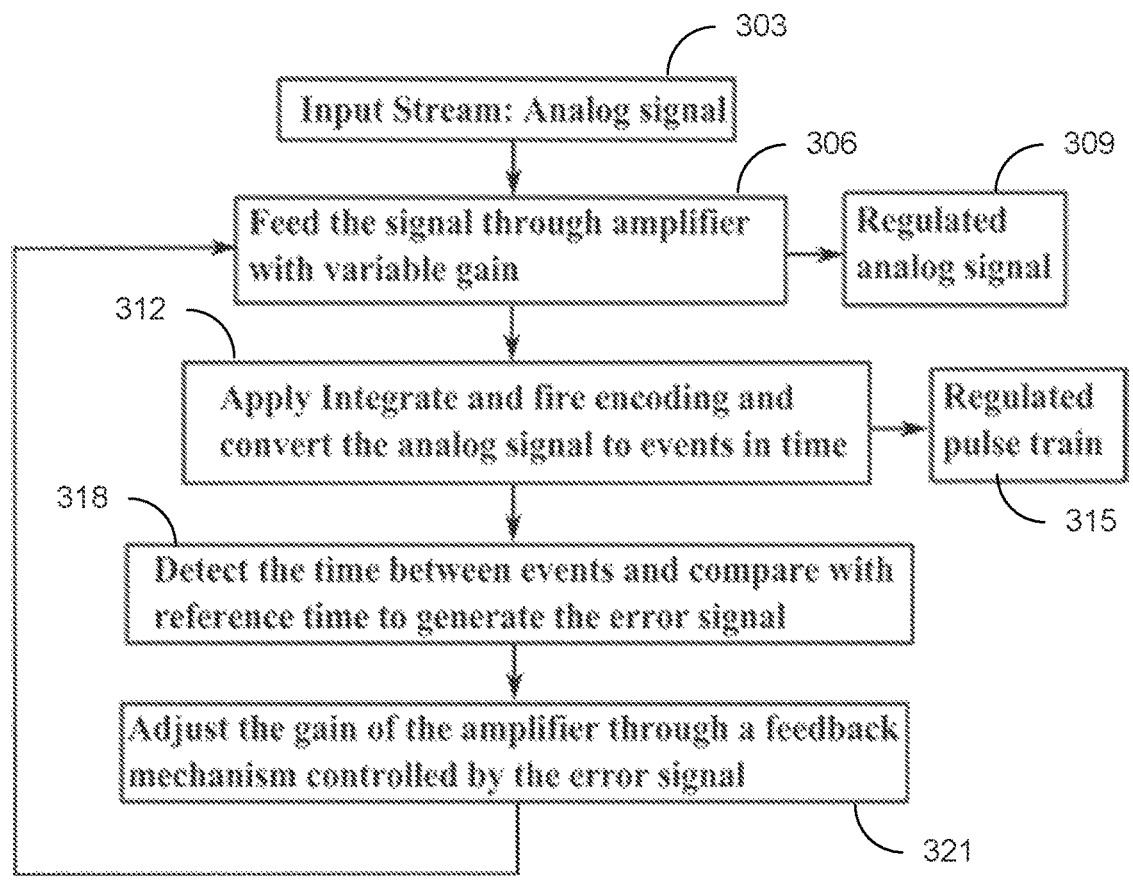
FIG. 3 is a flowchart illustrating an example of the operation of the pulse-based AGC architecture of FIG. 2 in accordance with various embodiments of the present disclosure.

The flowchart of the disclosed pulse-based AGC is shown in FIG. 3. The analog signal of the input stream 303 is fed through the amplifier 103 (FIG. 2) with variable gain at 306. A regulated analog signal can be provided by the VGA 103 at 309. At 312, the IF encoding is applied to the amplified signal to convert it to events in time by the IF sampler 206 (FIG. 2). A regulated pulse train can be provided by the IF sampler 206 at 315. The time between the pulse-based events are detected and compared with a reference time in the gain adjustment block 209 (FIG. 2) to generate an error signal at 318. The gain of the amplifier 103 is adjusted through a feedback mechanism controlled by the error signal at 321.

The disclosed pulse-based AGC system of FIG. 2 is drastically different from existing analog AGC's. Instead of detecting parameters based on amplitude or modulation, the timing is detected between IF pulses and then used to vary the gain of the amplifier 103. By the novel inclusion of the IF sampler 206 in the AGC loop, both the analog amplitude and the timing of the pulse train can be controlled simultaneously. Thus the proposed system can be used in both analog signal processing systems and pulse based signal processing systems. The basic components of the proposed AGC system are described below.

Figure 4:
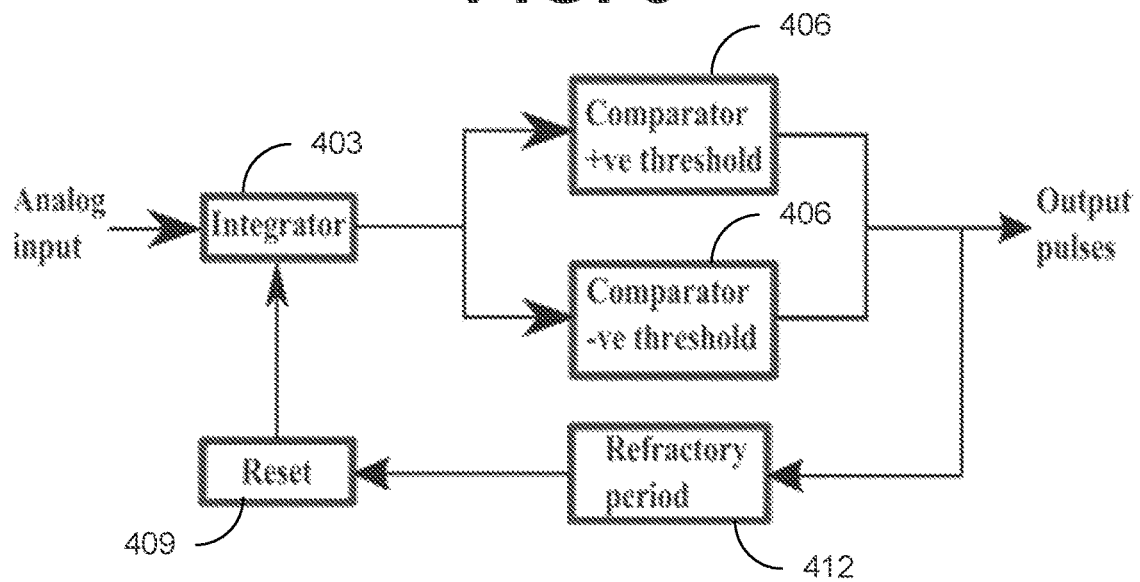
FIG. 4 is a schematic diagram illustrating an example of an integrate-and-fire (IF) sampler of the pulse-based AGC architecture of FIG. 2 in accordance with various embodiments of the present disclosure.

IF sampler as time detector. Information in an IF encoded signal is in the timing between events referred to as pulses. A block level schematic of an example of the IF sampler 206 is shown in FIG. 4. The continuous analog input x(t) is convolved with an averaging function u(t) by an integrator 403. The result of the convolution is compared against two fixed thresholds $\{\theta_p, \theta_n\}$ by comparators 406. When either of these thresholds is reached or exceeded, an output pulse corresponding to the polarity of the threshold crossed is generated at that time instant. The output pulse represents that the area of the input signal reached the threshold value. The integrator is reset 409 and held at this state for a specific duration given by the refractory period ($\tau$) 412 to prevent two pulses from being too close to each other and then the process repeats.

Let $u(t)=e^{\alpha(t-t_{k+1})}$ be the leaky factor in the integration 403 and $t_0$ be the starting time of the continuous signal x(t), then:

$$\theta_k = \int_{t_k+\tau}^{t_{k+1}} x(t) e^{\alpha(t-t_{k+1})} dt, \tag{1}$$

where $\theta_k = \{\theta_p, \theta_n\}$ and $\alpha, \tau > 0$.

A non-uniformly distributed set of events is generated by this process, which is referred to as a pulse train. The pulse train generated by IF represents the amplitude of the real world analog signal through an injective mapping, with a unique inverse between the two representations. Let $T_m$ be the timing of the $m^{th}$ pulse. Then the time between the pulses $T_{m+1}-T_m$ is fed into the gain adjustment 215 (FIG. 2) where it is used to generate the control signal to vary the gain of the amplifier 103 (FIG. 2).

Figure 5:
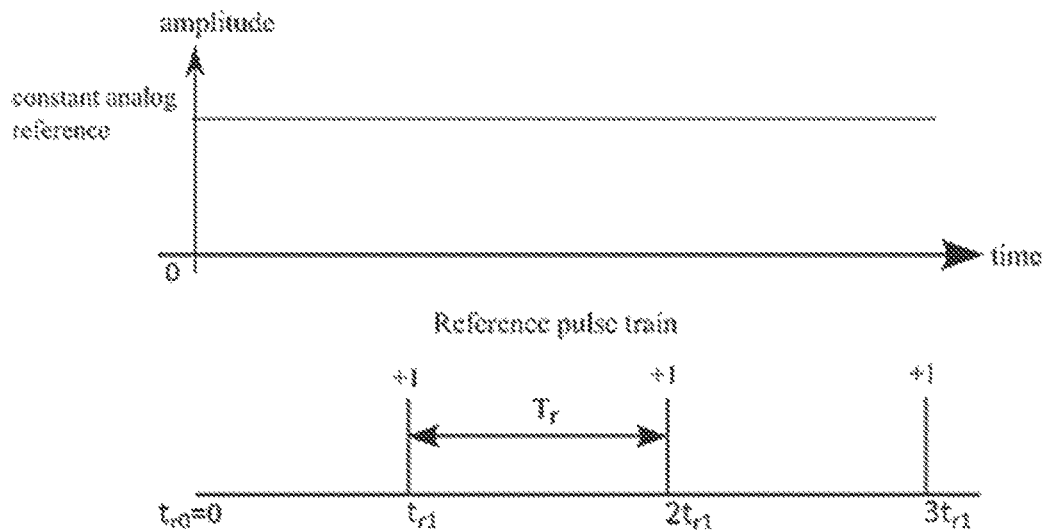
FIG. 5 illustrates an example of a reference pulse train generated from a constant analog reference signal in accordance with various embodiments of the present disclosure.
Figure 6:
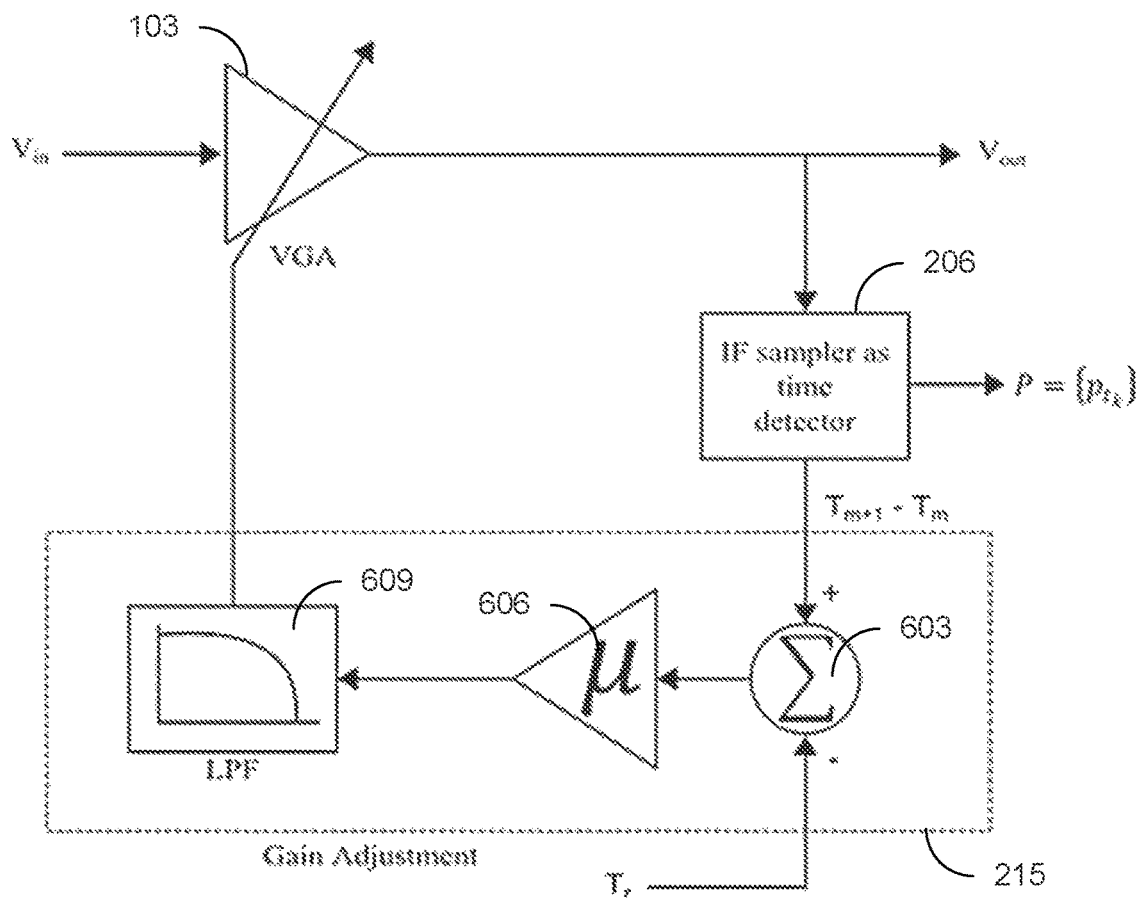
FIGS. 6 and 7 are schematic diagrams illustrating examples of pulse-based AGC architectures in accordance with various embodiments of the present disclosure.
Figure 7:
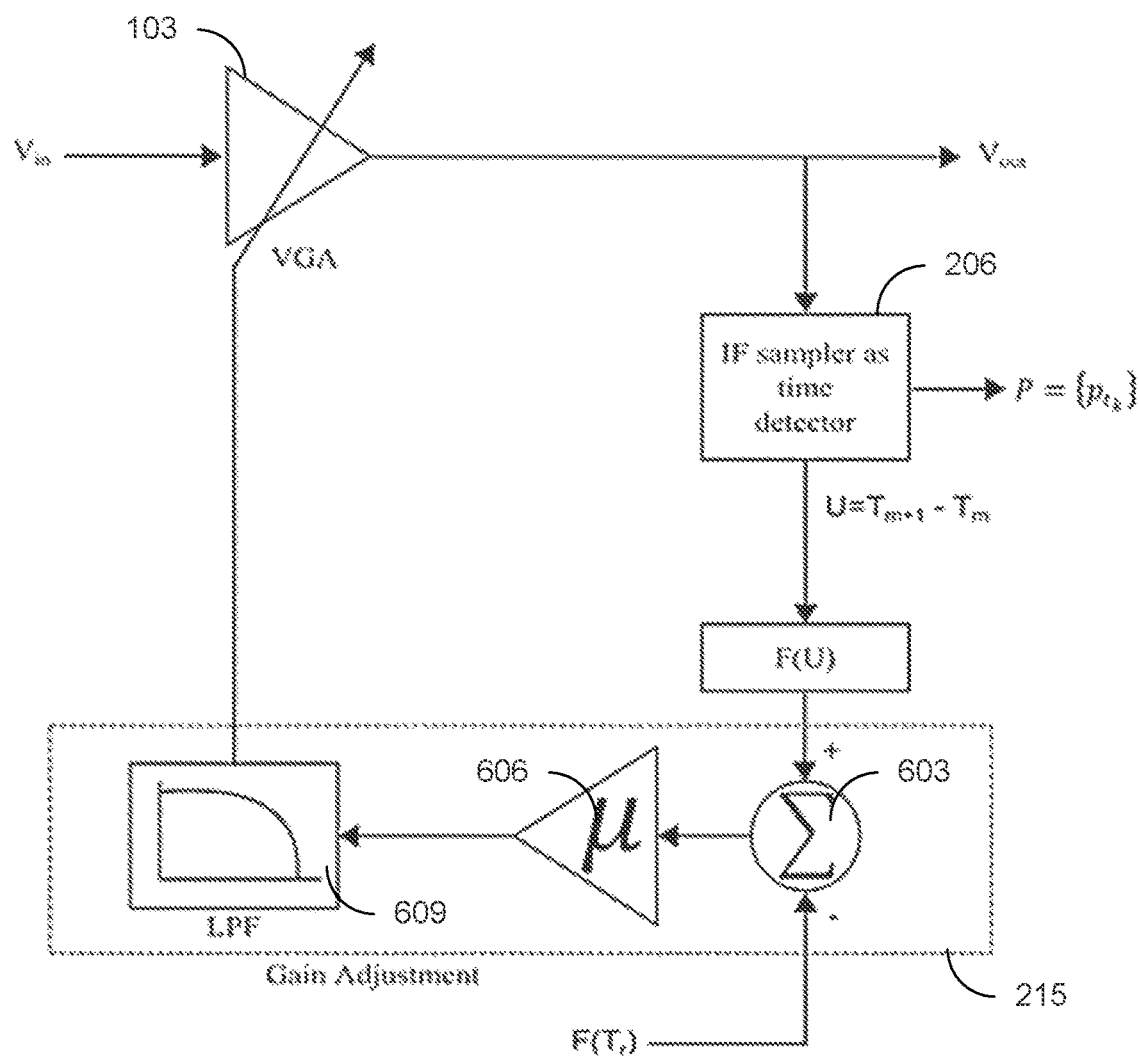

Gain adjustment: The gain adjustment 215 can comprise a summer 603 (e.g., a differential amplifier), feedback factor 606 and a low pass filter 609 as illustrated in FIGS. 6 and 7. The time between pulses from the IF sampler 206 is compared against the reference time to generate the error signal. The reference is the time interval of a pulse train where the interval corresponds to a constant analog value against which the amplitude and the pulse timings has to be controlled. So it is a periodic pulse train, i.e., the inter-pulse intervals are equal and correspond to a constant area under the analog curve as illustrated in FIG. 5.

There are two ways to obtain the reference time: (1) the constant analog reference can be passed through an IF sampler to generate the reference pulse train and the timing between pulses gives the reference time, $T_r$; or (2) the reference time can be computed analytically using the formula $$T_r = \ln\left[\frac{c}{c-\theta\alpha}\right]^{\frac{1}{\alpha}},$$

where c, θ, α are the constant analog reference, IF threshold and IF leak factor, respectively. Here, the refractory period can be assumed to be zero. For a non-zero refractory period, it can simply be added to $T_r$. The error signal is then multiplied by the feedback factor μ and passed through a low pass filter to generate the control signal which varies the gain of the amplifier as shown in FIG. 6.

It is to be noted that instead of using time, a function of the time between pulses F(U) can also be used to generate the error signal as shown in FIG. 7. The function can be a logarithmic function, inverse function, etc. The output of the IF sampler 206 as well as the reference time are transformed by the same function. Then the control signal is generated in the same way as in FIG. 6.

Results

Figure 8:
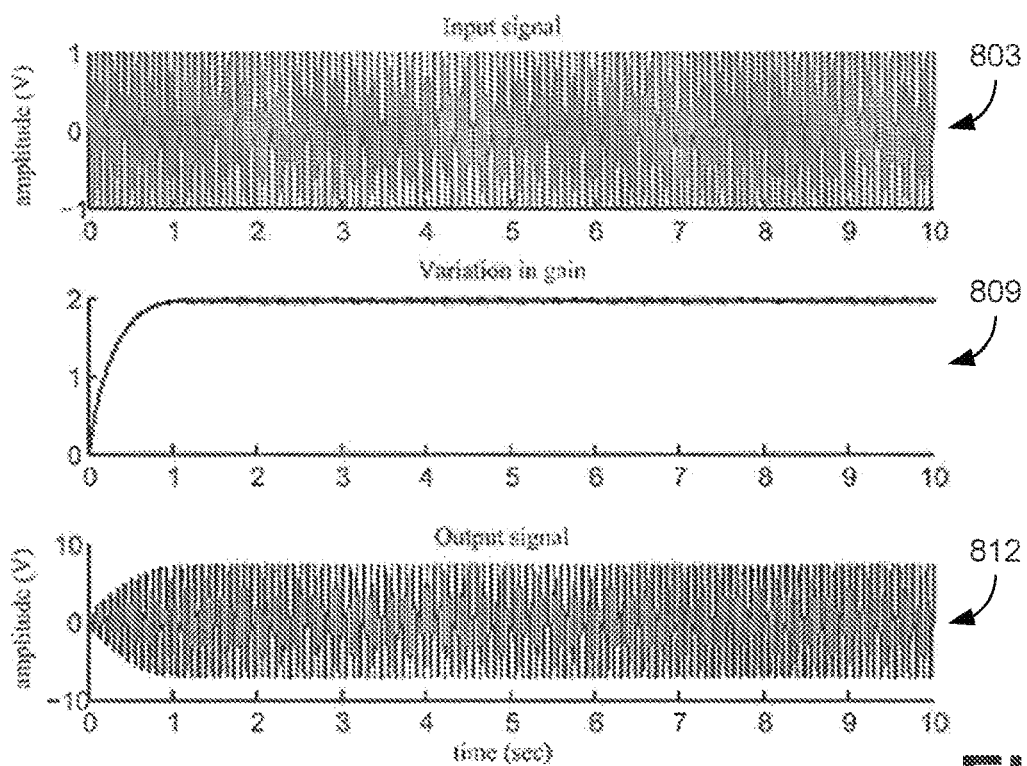
FIG. 8 illustrates examples of input, gain and output signals of a variable gain amplifier of the pulse-based AGC architecture of FIGS. 6 and 7 in accordance with various embodiments of the present disclosure.
Figure 9:
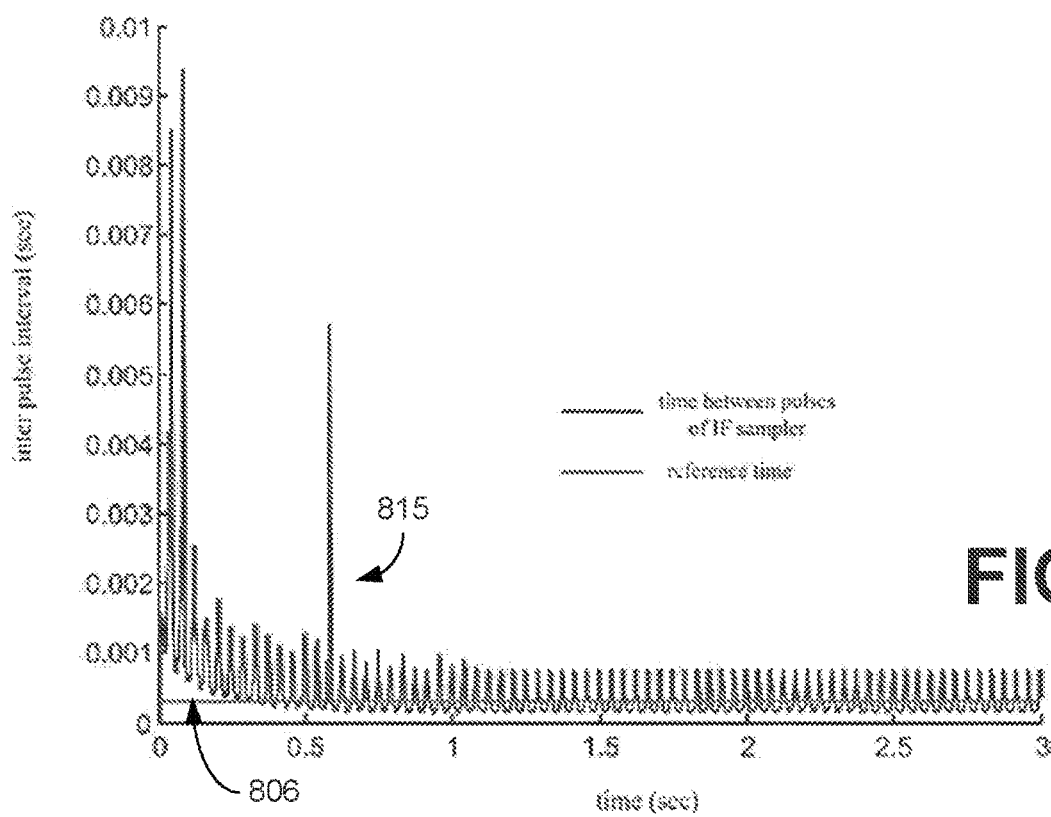
FIG. 9 illustrates an example of time between pulses in accordance with various embodiments of the present disclosure.
Figure 10:
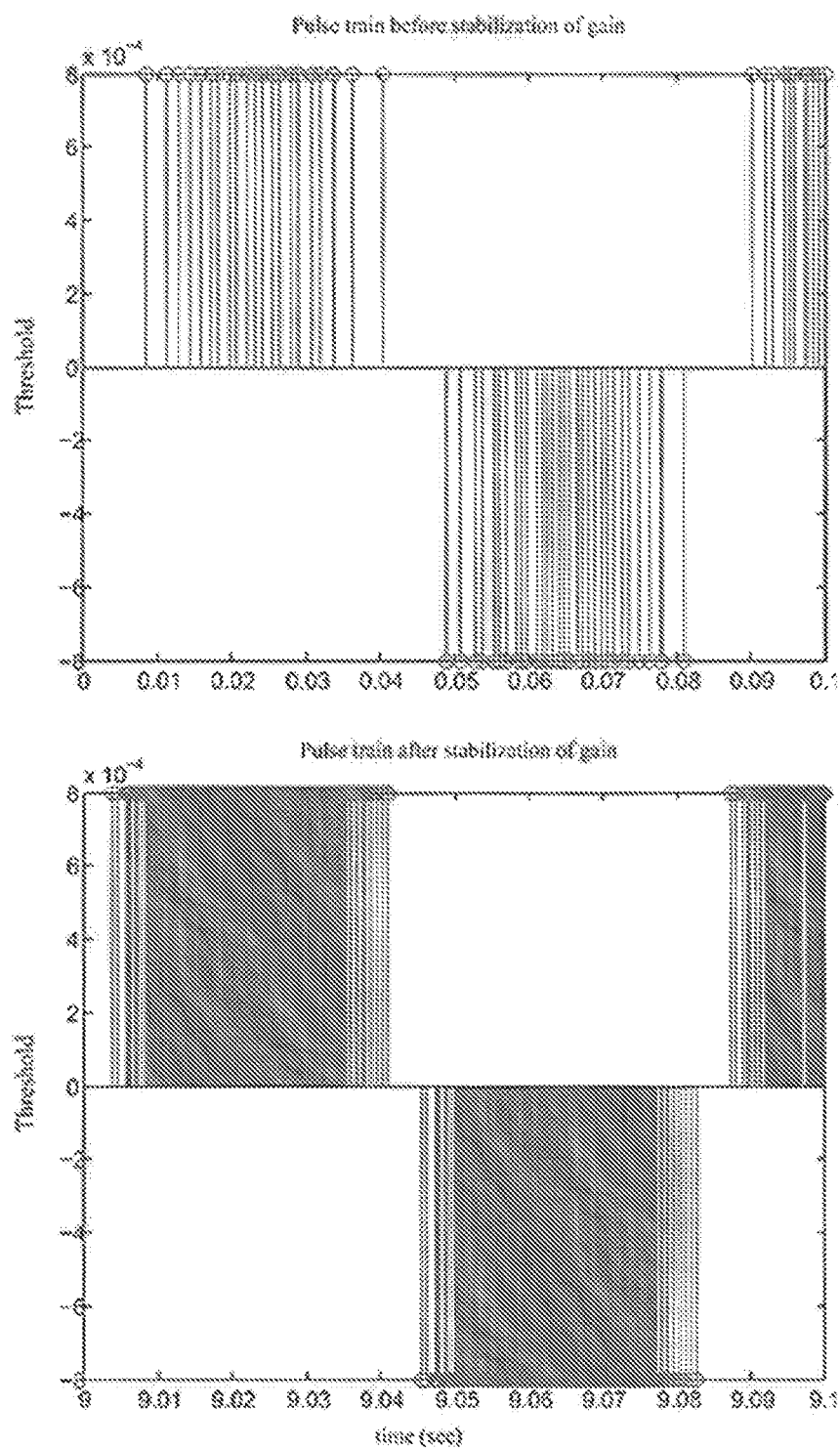
FIG. 10 illustrates examples of pulse trains before and after stabilization of gain in accordance with various embodiments of the present disclosure.

Examples of controlling the gain automatically with the proposed system are shown in FIG. 8. The input signal 803 is a 12 Hz sinusoidal signal of 1V. The reference time 806 was set as shown in FIG. 9 so to increase the amplitude of the signal 803. It can be seen from FIG. 8 that the gain 809 increases initially until it stabilizes after 1 sec resulting in increasing the amplitude of the output signal 812. By increasing the amplitude of the output signal 812, the time between pulses 815 decreases, which in turn increases the pulse density of the IF pulse train as shown in FIG. 10. Moreover, by controlling the amplitude, the time between pulses 815 are also regulated as shown in FIG. 9. Thus both analog and pulse domain are regulated simultaneously with the proposed AGC system.

In this disclosure, various implementations of a pulse domain AGC system has been presented, as well as their implementation schemes. The disclosed system can be used to directly control and regulate an analog signal and the output of the IF sampler.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about y".

Therefore, at least the following is claimed:

1. A pulse-based automatic gain control (AGC), comprising:
   a variable gain amplifier (VGA) configured to amplify an analog input signal to generate an analog output signal based upon an amplification control signal;
   an integrate-and-fire (IF) sampler configured to generate a pulse train, the pulse train comprising a series of constant amplitude pulses corresponding to the analog output signal; and
   a gain adjustment configured to generate the amplification control signal based upon a comparison of time between the pulses of the pulse train to a reference time, wherein the reference time corresponds to a time between the pulses of another pulse train generated by another IF sampler based upon a constant analog input signal.

2. The pulse-based AGC of claim 1, wherein the IF sampler is configured to detect the time between the pulses of the pulse train.

3. The pulse-based AGC of claim 1, wherein the gain adjustment is configured to:
   generate an error signal corresponding to the difference between the reference time and the time between the pulses of the pulse train; and
   adjust the error signal based upon a defined feedback factor to generate the amplification control signal.

4. The pulse-based AGC of claim 3, wherein the gain adjustment comprises a summer to generate the error signal and a multiplier to adjust the error signal by the feedback factor.

5. The pulse-based AGC of claim 3, wherein the gain adjustment is further configured to low pass filter the amplification control signal.

6. The pulse-based AGC of claim 1, wherein the gain adjustment is configured to:
   generate an error signal corresponding to the difference between a function of the reference time and a function of the time between the pulses of the pulse train; and
   adjust the error signal based upon a defined feedback factor to generate the amplification control signal.

7. The pulse-based AGC of claim 6, wherein the function of the reference time and the function of the time between the pulses are the same function.

8. The pulse-based AGC of claim 6, wherein both the function of the reference time and the function of the time between the pulses are a logarithmic function or an inverse function.

9. The pulse-based AGC of claim 6, wherein the gain adjustment is further configured to low pass filter the amplification control signal.

10. The pulse-based AGC of claim 1, wherein the reference time includes a refractory period of the IF sampler.

11. A pulse-based automatic gain control (AGC), comprising:
   a variable gain amplifier (VGA) configured to amplify an analog input signal to generate an analog output signal based upon an amplification control signal;
   an integrate-and-fire (IF) sampler configured to generate a pulse train corresponding to the analog output signal; and
   a gain adjustment configured to generate the amplification control signal based upon a comparison of time between pulses of the pulse train to a reference time, wherein the reference time corresponds to a time between the pulses of a pulse train generated by another IF sampler based upon a constant analog input signal or a time determined from a constant analog reference, an IF threshold and an IF leaky factor of the IF sampler.

12. The pulse-based AGC of claim 11, wherein the reference time is calculated analytically using a defined relationship between the constant analog reference, the IF threshold and the IF leaky factor of the IF sampler.

13. The pulse-based AGC of claim 11, wherein the reference time accounts for a refractory period of the IF sampler.

14. The pulse-based AGC of claim 11, wherein the reference time corresponds to a time between the pulses of another pulse train generated by another IF sampler based upon a constant analog input signal.

15. The pulse-based AGC of claim 11, wherein the reference time is determined based at least in part upon a constant analog reference, an IF threshold and an IF leaky factor of the IF sampler.

16. A method, comprising:
   determining time between constant amplitude pulses of an analog pulse train corresponding to an analog output signal from a variable gain amplifier (VGA), the pulse train generated from the analog output signal of the VGA using an integrate-and-fire (IF) sampler;
   determining a reference time based upon time between pulses of another pulse train generated from a constant analog reference signal using another IF sampler or a defined relationship between a constant analog reference, an IF threshold and an IF leaky factor of the IF sampler, or based at least in part upon a constant analog reference, an IF threshold and an IF leaky factor of the IF sampler;
   generating an amplification control signal based upon a comparison of the time between the pulses of the pulse train to the reference time; and
   adjusting amplification of the VGA in response to the amplification control signal.

17. The method of claim 16, wherein generating the amplification control signal comprises:
   generating an error signal corresponding to the difference between the reference time and the time between the pulses; and
   adjusting the error signal based upon a defined feedback factor to generate the amplification control signal.

18. The method of claim 17, wherein the amplification control signal is low pass filtered.

19. The method of claim 16, wherein the reference time accounts for a refractory period of the IF sampler.

20. The method of claim 16, wherein generating the amplification control signal comprises:
   an error signal corresponding to the difference between a function of the reference time and a function of the time between the pulses of the pulse train; and
   adjusting the error signal based upon a defined feedback factor to generate the amplification control signal.

21. The method of claim 20, wherein both the function of the reference time and the function of the time between the pulses are a logarithmic function or an inverse function.

* * * * *

UNITED STATES PATENT AND TRADEMARK OFFICE
CERTIFICATE OF CORRECTION

| | | |
|---|---|---|
| PATENT NO. | : 10,892,726 B2 | Page 1 of 1 |
| APPLICATION NO. | : 16/060610 | |
| DATED | : January 12, 2021 | |
| INVENTOR(S) | : Jose C. Principe and Gabriel Nallathambi | |

It is certified that error appears in the above-identified patent and that said Letters Patent is hereby corrected as shown below:

In the Claims

In Claim 3 (Column 6, Lines 49-50), replace "corresponding to the difference between" with --corresponding to a difference between--

In Claim 6 (Column 6, Lines 63-64), replace "corresponding to the difference between" with --corresponding to a difference between--

In Claim 14 (Column 7, Lines 36-37), replace "a time between the pulses of another pulse train generated by another IF sampler" with --the time between the pulses of the pulse train generated by the other IF sampler--

In Claim 14 (Column 7, Line 38), replace "a constant analog input signal" with --the constant analog input signal--

In Claim 15 (Column 7, Lines 40-42), replace "a constant analog reference, an IF threshold and an IF leaky factor of the IF sampler" with --the constant analog reference, the IF threshold and the IF leaky factor of the IF sampler--

In Claim 17 (Column 8, Lines 23-24), replace "corresponding to the difference between" with --corresponding to a difference between--

In Claim 20 (Column 8, Line 34), replace "corresponding to the difference between" with --corresponding to a difference between--

Signed and Sealed this
Seventeenth Day of August, 2021

Drew Hirshfeld
*Performing the Functions and Duties of the*
*Under Secretary of Commerce for Intellectual Property and*
*Director of the United States Patent and Trademark Office*